(12) United States Patent
Tanaya

(10) Patent No.: US 7,015,630 B2
(45) Date of Patent: Mar. 21, 2006

(54) PIEZOELECTRIC VIBRATION PIECE, PIEZOELECTRIC DEVICE USING PIEZOELECTRIC VIBRATION PIECE, PORTABLE PHONE UNIT USING PIEZOELECTRIC DEVICE, AND ELECTRONIC EQUIPMENT USING PIEZOELECTRIC DEVICE

(75) Inventor: Hideo Tanaya, Suwa (JP)

(73) Assignee: Seiko Epson Corporation, (JP)

( * ) Notice: Subject to any disclaimer, the term of this patent is extended or adjusted under 35 U.S.C. 154(b) by 27 days.

(21) Appl. No.: 10/735,860

(22) Filed: Dec. 15, 2003

(65) Prior Publication Data

US 2005/0040737 A1 Feb. 24, 2005

(30) Foreign Application Priority Data

Dec. 17, 2002 (JP) ............................. 2002-365531

(51) Int. Cl.
*H03H 9/21* (2006.01)
*H01L 41/04* (2006.01)
*H01L 41/08* (2006.01)

(52) U.S. Cl. ...................................... 310/370; 333/200
(58) Field of Classification Search ................. 310/370
See application file for complete search history.

(56) References Cited

U.S. PATENT DOCUMENTS

| | | | |
|---|---|---|---|
| 6,791,243 B1 * | 9/2004 | Kawashima | ................ 310/370 |
| 6,806,797 B1 * | 10/2004 | Kikushima | ................. 333/200 |
| 2002/0121941 A1 * | 9/2002 | Sakata et al. | ............... 331/154 |

FOREIGN PATENT DOCUMENTS

| | | | | |
|---|---|---|---|---|
| JP | 56089117 A | * | 7/1981 | |
| JP | 56094813 A | * | 7/1981 | |
| JP | 2003092530 A | * | 3/2003 | |

* cited by examiner

*Primary Examiner*—Darren Schuberg
*Assistant Examiner*—J. Aguirrechea
(74) *Attorney, Agent, or Firm*—Harness, Dickey & Pierce, P.L.C.

(57) ABSTRACT

A piezoelectric vibration piece is provided including a pair of vibration arms that are formed of a piezoelectric material, and extend in a horizontal direction from a base section. Grooves with a bottom are provided in the vibration arms, and extend along the length direction of the corresponding vibration arm. Support sections are provided in such a manner to cross the groove in a width direction to integrally connect the material structuring the vibration arm separated by the groove in the width direction.

12 Claims, 7 Drawing Sheets

PIEZOELECTRIC VIBRATION PIECE, PIEZOELECTRIC DEVICE USING PIEZOELECTRIC VIBRATION PIECE, PORTABLE PHONE UNIT USING PIEZOELECTRIC DEVICE, AND ELECTRONIC EQUIPMENT USING PIEZOELECTRIC DEVICE

FIELD OF THE INVENTION

The present invention relates to a piezoelectric vibration piece, a piezoelectric device accommodating the piezoelectric vibration piece in its package, and a portable phone and electronic equipment using the piezoelectric device.

In small-sized information equipment such as HDDs (Hard Disk Drives), mobile computers, or IC cards, and mobile communications devices such as portable phones, car phones, or paging systems, piezoelectric devices such as piezoelectric vibrators and piezoelectric oscillators each accommodating a piezoelectric vibration piece in their packages are widely used.

FIG. 11 is a schematic cross-sectional view showing an exemplary structure of such a piezoelectric device.

In FIG. 11, a piezoelectric device 1 is accommodating a piezoelectric vibration piece 3 in its package 2. The package 2 is formed in a shape of shallow box made by an insulation material, and the internally-accommodated piezoelectric vibration piece 3 is securely fixed therein before the package is sealed by a lid body 4.

The package 2 is formed by mold-laminating a plurality of substrates 2a, 2b, and 2c, each being a ceramic green sheet, before subjecting the package 2 to sintering. Inside of the substrates 2b and 2c, a hole is formed by eliminating the material at the time of substrate formation. As such, a space is formed for accommodating the piezoelectric vibration piece 3.

The piezoelectric vibration piece 3 is exemplarily formed, as shown in FIG. 12, by crystal etching. As shown in FIG. 12, the piezoelectric vibration piece 3 is structured by a crystal piece of a tuning fork type, including a base section 5, and a pair of vibration arms 6 and 7 that horizontally extend from the base section 5 in the right direction in the drawing.

The vibration arms 6 and 7 are formed, respectively, with grooves 6a and 7a extending in the length direction. FIG. 13 shows a cross-sectional view of vibration arm 7 cut along line B—B. As shown in FIG. 13, excitation electrodes 8a and 8b are formed, and with respect to these excitation electrodes 8a and 8b, a driving voltage is externally applied. As a result, as shown by arrows in FIG. 13, the vibration arm 7 is internally formed with an electric field. By the action of such an electric field, with respect to the vibration arms 6 and 7 of FIG. 12, both sides of each of the grooves 6a and 7a repeatedly expand and contract as indicated by the arrows.

As such, as shown in FIG. 12, the vibration arms 6 and 7 vibrate so that the tip sides thereof come near or apart as shown by arrow A. Note here that, in FIG. 12, the movement of the vibration arms 6 and 7 is extremely exaggerated compared to the actual movement, for convenience of understanding. Extracting the vibration frequency, based on such vibration, enables application to various signals exemplified by a control clock signal and the like.

Here, the vibration of the vibration arms 6 and 7 along arrow A of FIG. 12 is a horizontal movement along the direction of arrow x of FIG. 13 (hereinafter, this direction is referred to as "horizontal direction").

In FIG. 13, the manufacturing process of forming the grooves 7a on the surface side and back side of the vibration arm 7 is shown. The grooves 7a are formed by half etching the surface side and the back side of the vibration arm 7. The vibration arm 7 has an arm width of only about 100 μm, and the grooves 7a are formed on the surface side and the back side separately. Thus, as shown in FIG. 13, the grooves 7a are sometimes deviated from each other in the right and left directions, respectively.

In such a state, as shown in FIG. 12, when the vibration arms 6 and 7 vibrate in the direction of arrow A, the resulting movement is added with the movement of a component in the z direction of FIG. 13 (below, this direction is referred to as "vertical direction"). The resulting vibration becomes one directed in the direction of arrow C.

Such a vibration property change causes various harmful effects. For example, FIG. 14 shows the interrelation between the temperature change and the frequency shift of the piezoelectric vibration piece 3 when the vibration arms 6 and 7 vibrate correctly in the direction of arrow A; and FIG. 15 shows the interrelation between the temperature change and the frequency shift of the piezoelectric vibration piece 3 when the vibration arms 6 and 7 vibrate with the movement of the vertical component as described by FIG. 13.

That is, a frequency f is expressed by the following equation, where k denotes a constant, E denotes an elastic constant, and I denotes a geometrical moment of inertia:

$$f = k \cdot (E \cdot I)^{-2} \tag{1}$$

Therefore, the temperature property will look like a secondary curve responding to the change of the elastic constant and the elastic secondary moment.

With a comparative study of the temperature property of such a piezoelectric vibration piece 3, as shown in FIG. 14, the maximum temperature with the frequency change is normal and in a close range of 25 degrees centigrade; and, as shown in FIG. 15, the temperature is shifted to the negative side and about 14 degrees centigrade.

It is desirable, therefore, to provide a piezoelectric vibration piece with appropriate vibration, a piezoelectric device that utilizes the piezoelectric vibration piece by suppressing the movement of vibration arms in the vertical direction and ensuring the rigidity along the almost entire length of the vibration arms, and a portable phone and electronic equipment using the piezoelectric device.

SUMMARY OF THE INVENTION

In view of the above desirability, the present invention, provides a piezoelectric vibration piece that includes a pair of vibration arms that are formed of a piezoelectric material, and extend in a horizontal direction from a base section. Moreover, a groove with a bottom is provided to the vibration arms that extends along a length direction of the corresponding vibration arm, and a support section is provided in such a manner so as to across the groove in the width direction to integrally connect the material structuring the vibration arm separated by the groove in the width direction.

According to the above structure, the groove provided to each of the vibration arms is a groove with a bottom. Thus, in comparison to the case of forming a penetrated groove to each of the vibration arms, the vibration arms of the present invention will have better rigidity. Further, to each of the grooves is provided a support section (member) formed so as to cross the groove in a width direction to integrally connect the material structuring the vibration arm separated by the groove in the width direction. With such a structure, the support section becomes integrated, especially with the bottom section of the groove, to support the material structuring the vibration arm separated by the groove in the width direction, thereby preventing a distortion from occurring. As a result, better rigidity can be achieved in the twisting direction of the corresponding vibration arm.

As such, there is no need to provide a plurality of support sections to the vibration arm. Thus, a piezoelectric vibration piece with an appropriate vibration can be exerted by ensuring the rigidity along almost the entire length of the vibration arm, with the movement of the vibration arm suppressed in the vertical direction.

A second aspect of the invention is characterized in that, in the above-defined structure, an integral section that is integrated with the bottom section of the groove of the support section is formed to be thicker than at least an end section of the support section that is located on an opening side of the groove.

According to the second aspect of the invention, the integral section that is integrated with the bottom section of the groove of the support section is formed so as to be thicker than at least the end section of this support section located on the opening side of the groove. In other words, the support section is formed in such a manner so as to increase its thickness toward the bottom section of the groove. Therefore, the support section is securely connected, especially to the bottom section of this groove. Accordingly, through such a secure fixation of the support section to the bottom section of this groove, the deformation force in the twisting direction of the vibration arms can be dealt with effectively. As such, a deformation in the twisting direction can be prevented from occurring in a more effective manner.

A third aspect of the invention is characterized in that, in either structure of the first or second aspects described above, the groove is provided to a surface side and a back side of each of the vibration arms.

According to the structure of the third aspect of the invention, each of the vibration arms is formed with the groove in its surface and back sides. Thus, groove formation with a fine width to the narrow vibration arm sometimes deviates the groove position on the surface side from that on the back side. However, such a groove with a bottom exerts a considerable effect in terms of enforcing rigidity of the vibration arms. Notwithstanding, the inventors of the present invention accept a process drawback such as groove deviation between the surface and back sides because, if any harmful effects are caused thereby, this problem is solved by forming the support section to each of the grooves on both the surface and back sides. That is, by providing a groove with a bottom section, together with forming the support section to each of the grooves on the surface and back sides, the movement of the vertical component of each of the vibration arms can be effectively suppressed.

A fourth aspect of the invention is characterized in that, in the structures of any one of the first to third aspects of the invention described above, a plurality of support sections are formed to one of the grooves.

According to the structure of the fourth aspect of the invention, a CI (Crystal Impedance) value is increased as the number of the support sections formed to one groove is increased. Increasing the number of the support sections improves the rigidity of the vibration arms.

A fifth aspect of the invention is characterized in that, in the structures of any one of the first to fourth aspects of the invention, each of the vibration arms has an arm width in a range from 50 $\mu$m to 150 $\mu$m, and a depth of the groove is preferably 30 percent or more, but less than 50 percent of the material thickness of each of the vibration arms.

According to the structure of the fifth aspect of the invention, when the arm width of the respective vibration arms is in a range from 50 $\mu$m to 150 $\mu$m and, assuming that the depth of the groove is less than 30 percent of the material thickness of each of the vibration arms, the reduction effects for the CI value cannot be enough. As such, the CI value fails to be practical. Further, if the depth of the groove exceeds 50 percent of the material thickness of the respective vibration arms, groove formation to the surface and back sides of the corresponding vibration arm becomes impossible.

A sixth aspect of the invention is characterized in that, in the structure of any one of the structures of the first to fifth aspects of the invention, a groove width of the groove provided to each of the vibration arms is 40 percent or more of the arm width of the corresponding vibration arm.

According to the structure of the sixth aspect of the invention, with a groove width that is 40 percent or more of the arm width of the vibration arm, the CI value can be appropriately controlled, so that a practical CI value can be realized.

A seventh aspect of the invention is characterized in that, in the structure of the sixth aspect of the invention, the groove width of the groove provided to each of the vibration arms is 70 percent or more of the arm width of the corresponding vibration arm.

According to the structure of the seventh aspect of the invention, with a groove width that is 70 percent or more of the arm width of the vibration arm, the CI value can be suppressed in the most effective manner, and with or close to 100 percent of the arm width of the vibration arm, groove formation to the vibration arm becomes impossible.

The above-described seventh aspect of the invention is achieved by a piezoelectric device accommodating a piezoelectric vibration piece in its case or package. The piezoelectric vibration piece includes a pair of vibration arms extending in a horizontal direction from a base section, a groove with a bottom that is provided to each of the vibration arms and extends along the length direction of each of the vibration arms, and a support section provided so as to across the groove in the width direction to integrally connect the material structuring the vibration arm, separated by the groove in the width direction.

According to an eighth aspect of the invention, to each of the vibration arms of the piezoelectric vibration piece accommodated in this piezoelectric device, a groove with a bottom is formed. The support section provided to the groove is structured to be integrated with the bottom section of the groove, to support the material structuring the vibration arm separated by the groove in the width direction. With such a structure, deformation is prevented from occurring. Thus, rigidity can be achieved in the twisting direction of each of the vibration arms. As such, with respect to the piezoelectric vibration piece accommodated in the piezoelectric device, rigidity is ensured along almost entire length of the vibration arm, with the movement of the vibration arms suppressed in the vertical direction. As such, an appropriate vibration is realized.

The above-described aspect is achieved by, according to a ninth aspect of the invention, a portable phone unit utilizing a piezoelectric device that accommodates a piezoelectric vibration piece in its case or package. A clock signal is derived for control by the piezoelectric device, in which the piezoelectric vibration piece includes a pair of vibration arms that extend in a horizontal direction from a base section, a groove with a bottom that is provided to each of the vibration arms and extends along the length direction of each of the vibration arms, and a support section provided so as to across the groove in a width direction to integrally connect the material structuring the vibration arm, separated by the groove in the width direction.

The above-described aspect is achieved by, according to a tenth aspect of the invention, electronic equipment that utilizes a piezoelectric device that accommodates a piezoelectric vibration piece in its case or package. A clock signal is derived for control by the piezoelectric device in which the piezoelectric vibration piece includes a pair of vibration arms that extend in a horizontal direction from a base section, a groove with a bottom that is provided to each of the vibration arms and extends along the length direction of each of the vibration arms, and a support section provided so as to across the groove in the width direction to integrally connect the material structuring the vibration arm, separated by the groove in the width direction.

DETAILED DESCRIPTION OF THE PREFERRED EMBODIMENTS

Figure 1:
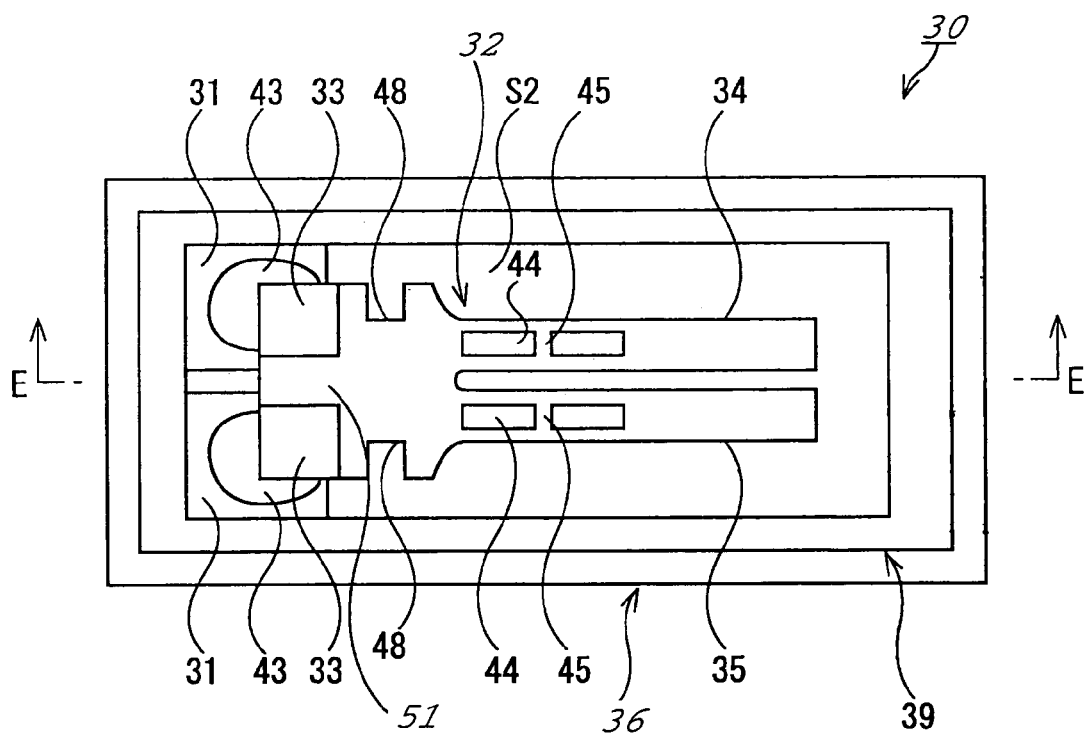
FIG. 1 is a schematic plan view showing an embodiment of a piezoelectric device according to a principle of the present invention.
Figure 2:
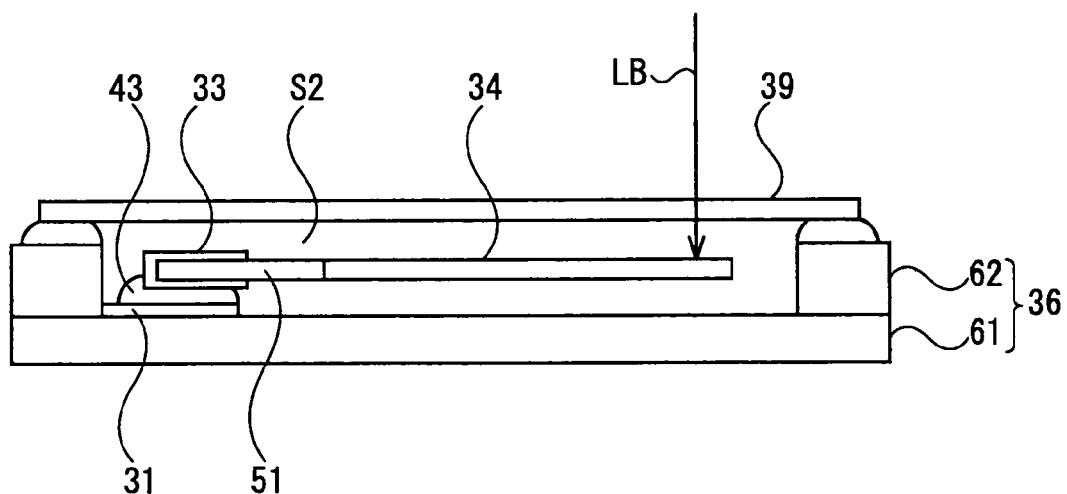
FIG. 2 is a schematic cross-sectional view cut along E—E line of FIG. 1.

FIGS. 1 and 2 both show a first embodiment of a piezoelectric device according to the principles the present invention. FIG. 1 is a schematic plan view thereof, and FIG. 2 is a schematic cross-sectional view cut along E—E line of FIG. 1.

In the drawings, a piezoelectric device 30 is exemplarily structuring a piezoelectric vibrator, and the piezoelectric device 30 is accommodating a piezoelectric vibration piece 32 in its package 36. As an insulating material, the package 36 is formed, for example, by mold-laminating a plurality of substrates. Each of the substrates is a ceramic green sheet made of aluminum oxide, before being subjected to sintering. Inside each of the plurality of substrates is formed a predetermined hole. Thus, after the substrates are laminated, a predetermined inner space S2 is formed inside. In this embodiment, for the purpose of minimizing the thickness of the package 36, a first substrate 61 and a second substrate 62 are laminated together. By eliminating the material inside of the second substrate 62, the space of inner space S2 is formed.

This inner space S2 is an accommodating space for accommodating the piezoelectric vibration piece 32.

In the inner space S2 of the package 36, in the vicinity of the left end section, electrode sections 31 formed by nickel plating or gold plating on tungsten metallization are provided.

These electrode sections 31 are connected to outside, and provided for supplying a driving voltage. Coated on the respective electrode sections 31 is a conductive adhesive 43. On the conductive adhesive 43, extraction electrodes 33 provided to both end sections are mounted in the width direction of the base section 51 of the piezoelectric vibration piece 32. Thereby, the conductive adhesive 43 is hardened. The conductive adhesive 43 is a mixture of conductive particles such as silver fine particles and a synthetic resin as an adhesive component that exerts a bonding force. Silicone, epoxy, or a polyimide conductive adhesive and the like, for example, may be used as the synthetic resin.

The piezoelectric vibration piece 32 is preferably formed of crystal. Other materials that may be used for the piezoelectric material, for example, are tantalic acid lithium or lithium niobate. In the present embodiment, the piezoelectric vibration piece 32 is small-sized, in such a shape as shown in the drawing to derive any necessary capability.

That is, the piezoelectric vibration piece 32 includes a base section 51 that is fixed to the side of the package 36 in a manner that will be described later. Also included are a pair of vibration arms 34 and 35 that are bifurcated and extend parallel from the base section 51 to the right direction in the drawing. As such, a so-called tuning-fork type piezoelectric vibration piece, which has a shape of tuning-fork, is used.

A lid body 39 is coupled to an opened upper end of the package 36 for sealing. The lid body 39 is preferably formed of a light-transmission material. More specifically, a thin-plate glass is used for the lid body 39. After sealingly fixing the lid body 39 to the package 36, the lid body 39 is used for frequency adjustment by a mass reduction process after externally applying a laser light LB to the metal-coated part of the piezoelectric vibration piece 32 or a part of the excitation electrode (not shown), as shown in FIG. 2.

A glass material suited for the lid body 39 is, for example, a thin-plate glass that is manufactured by a downdraw process, for example, from borosilicate glass.

Now referring to FIGS. 3 and 4, the piezoelectric vibration piece 32 to be accommodated in the package 36 of the piezoelectric device 30 will be described in detail.

Figure 3:
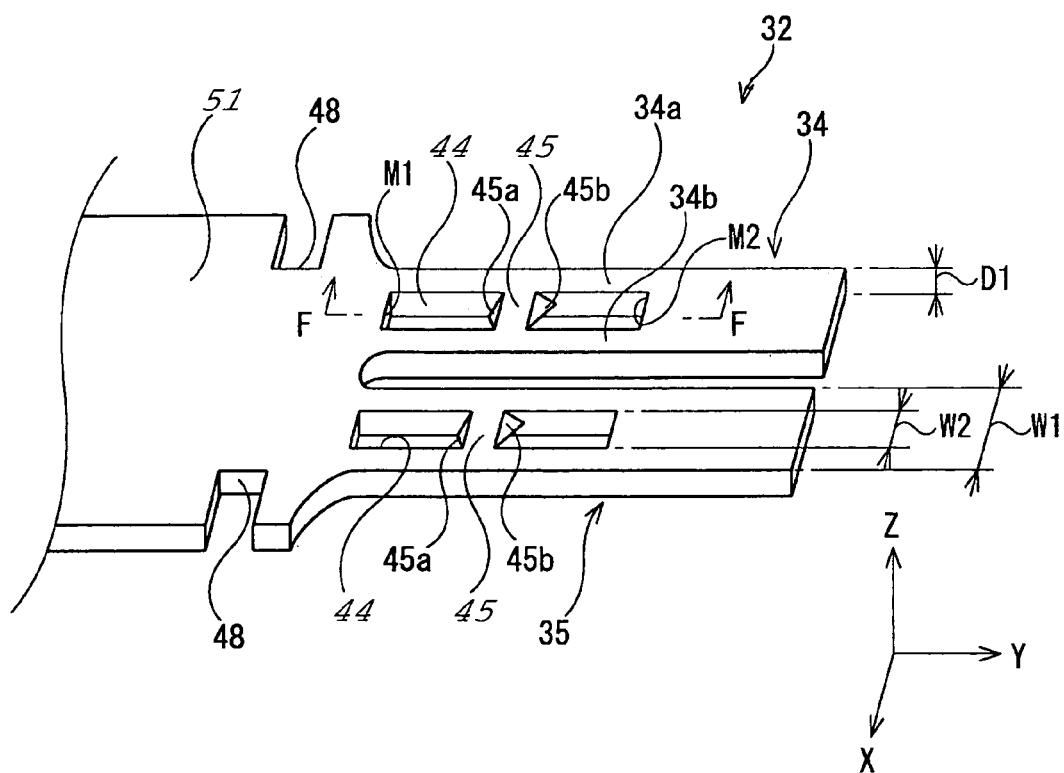
FIG. 3 is a schematic perspective view showing the main section of a piezoelectric vibration piece to be used for the piezoelectric device of FIG. 1.
Figure 4:
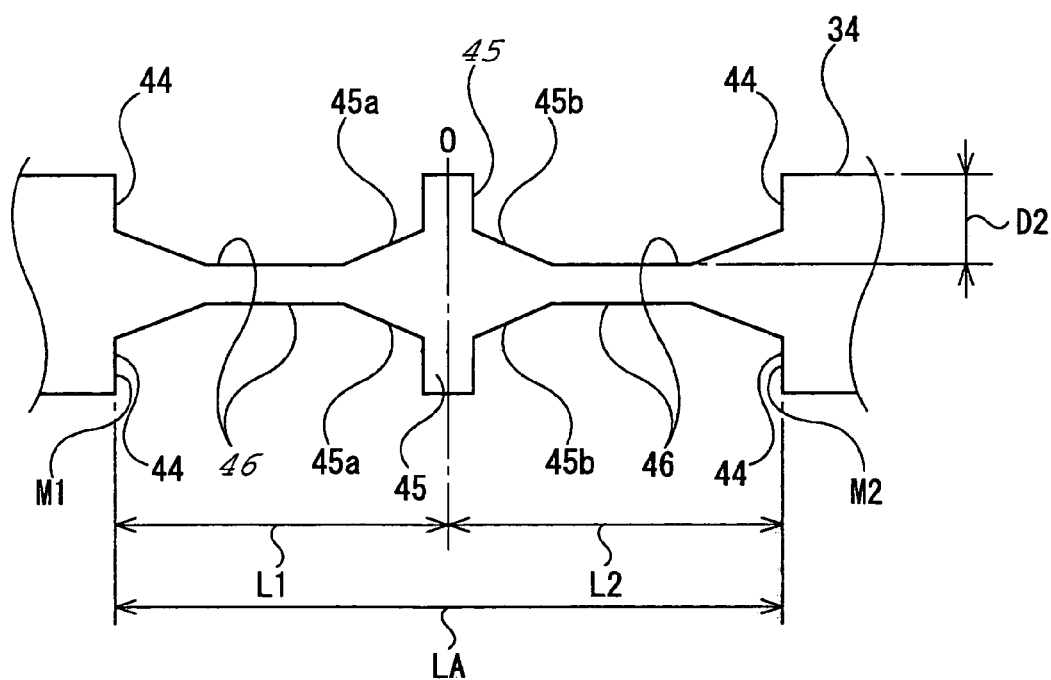
FIG. 4 is a cross-sectional view cut along F—F line of FIG. 3.

FIG. 3 is a schematic perspective view showing the structure of the piezoelectric vibration piece 32, and FIG. 4 is a cross-sectional view cut along F—F line of FIG. 3 (a diagram showing only the cross-sectional plane). In FIG. 3, the piezoelectric vibration piece 32 is formed, for example, by processing a crystal that is a piezoelectric material to be a tuning-fork type piezoelectric vibration piece 32. In this case, a cutting of the monocrystals that form crystal is done in such a manner that the X axis of FIG. 3 will be an electrical axis, the Y axis will be a mechanical axis, and the Z axis will be an optical axis. When such a cutting is done to the monocrystals of the crystal, in the orthogonal coordinates system structured by the above-described X, Y and Z axes, an XY plane structured by the X and Y axes is formed by tilting about −5 to +5 degrees in a counterclockwise direction about the X axis.

In FIG. 3, under such a condition, the piezoelectric vibration piece 32 is provided with a pair of vibration arms 34 and 35 that horizontally (laterally) extend from the base section 51. In the present embodiment, the piezoelectric vibration piece 32 includes, in the vicinity of the base end sections of the vibration arms 34 and 35 of the base section 51, constriction sections or notch sections 48 which are formed by expanding or contracting the width of the base section 51. By including such notch sections 48 in the piezoelectric vibration piece 32, no vibration is transferred from the vibration arms 34 and 35 to the side of the base section 51.

The vibration arms 34 and 35 are provided with grooves 44 that extend in the length direction. These grooves 44 are, as shown in FIG. 4, formed on the surface and back sides of each vibration arm 34. Although not shown in FIG. 4, the groove 44 formed to the vibration arm 35 has the same structure as the vibration arm 34 shown in FIG. 4. In FIG. 4, the total length from one end section M1 to another end section M2, in the length direction of the groove 44, is denoted by LA.

Further, in the vicinity of both end sections in the width direction of the end section (left end section in FIG. 2) of the base section 51 of the piezoelectric vibration piece 32, as already described above, extraction electrodes 33 for connection with the electrode sections 31 of the package 36 are formed. The extraction electrodes 33 are both provided to the surface and back sides of the base section 51 of the piezoelectric vibration piece 32. Such extraction electrodes 33 are connected to excitation electrodes (not shown) provided in the grooves 44 of the vibration arms 34 and 35.

Next, the structure of the grooves 44 provided to the vibration arms 34 and 35 will be described. The grooves 44 have the same structure for each of the vibration arms 34 and 35. Thus, by showing either groove in FIGS. 3 and 4, the comprehensive relationship between the vibration arms and grooves is described.

The arm width W1 of the piezoelectric vibration piece 32 is, for example, in a range from 50 $\mu$m to 150 $\mu$m. With respect to the thickness D1 of the vibration arm 34 of the piezoelectric vibration piece 32, the groove depth D2 of the groove 44 of FIG. 4 is set to be 30 percent or more, but less than 50 percent of D1.

The groove width W2 of the groove 44 is, preferably, set to be 40 percent or more of the arm width W1 of the vibration arm 35, and more preferably, 70 percent or more.

Moreover, as shown in FIG. 3, the material structuring the vibration arm 34 (in this embodiment, "crystal material") is separated into two parts of 34a and 34b by the groove 44 provided in the vibration arm 34. As shown in FIG. 4, the bottom section 46 is integrally formed therebetween. Thus, the groove 44 is a groove with a bottom, and does not penetrate therethrough the arm 34.

Furthermore, as shown in FIG. 3, the grooves 44 of the vibration arms 34 and 35 are provided with support sections 45 of a sidebar type, for example. More specifically, the parts 34a and 34b, formed as a result of the separation by the groove 44 of the vibration arm 34, are integrally connected to the support section 45.

As shown in FIG. 4, the support section 45 is formed to be integrated with the bottom section 46 of the groove 44, and the resulting integral sections 45a and 45b, both being integrated with the groove bottom section 46 of the support section 45, are formed to be thicker than the opening end section of at least the groove 44 of the support section 45. Specifically, the integral section 45a where the support section 45 and the bottom section 46 are integrated extends toward the bottom section 46, and looks like a bell-bottom.

In this embodiment, as shown in FIG. 4, the groove 44 and the support section 45 have a one-to-one relationship. That is, the distance L1 from one end section M1 of the groove 44 to the center O of the support section 45 is equal to the distance L2 from the center O of the support section 45 to the other end section M2 of the groove 44.

With such a structure, the total length LA of the groove 44 is divided into two by the support section 45. As such, when the piezoelectric vibration piece 32 is driven, the bending vibration is equally divided by the support section 45. Thus, deformation in the twisting direction is cancelled out which prevents twisting deformation.

Further, a plurality of support sections 45 may be provided as long as they fit in the range of the total length LA of the groove 44. In this manner, the vibration arm 34 has an increased rigidity, and the CI value is also increased. Accordingly, in the allowance range for increase of the CI value, by increasing the number of the support sections 45, the rigidity of the vibration arm 34 can be increased to a greater degree.

The present embodiment is structured as above, and as shown in FIG. 4, the grooves 44 formed in the vibration arms 34 and 35 of the piezoelectric vibration piece 32 are grooves with a bottom. Thus, compared to a case of forming a penetrating groove through both the vibration arms 34 and 35, these vibration arms 34 and 35 are provided with better rigidity.

What is more, in FIGS. 3 and 4, the grooves 44 are each provided with the support section 45. Since the support section 45 is integrated with the bottom section 46 of the groove 44, the support section 45 supports the materials 34a and 34b (walls) that structure the vibration arm 34, separated by the groove 44 in the width direction, so that deformation is prevented from occurring. Accordingly, the vibration arm 34 has rigidity in the twisting direction thereof.

As such, with the piezoelectric vibration piece 32, there is no need to provide a plurality of support sections 45 to the groove 44 of the vibration arm 34 or 35. Thus, the CI value is not increased, appropriate vibration can be realized by ensuring rigidity along almost the entire length of the vibration arms, with the movement of the vibration arms 34 and 35 being suppressed in the vertical direction.

Further, as shown in FIG. 4, the support section 45 includes integral sections 45a and 45b that are thicker towards the bottom section 46 of the groove 44. Thus, the support section 45 is securely connected, especially to the bottom section 46, of the groove 44. Accordingly, in the piezoelectric vibration piece 32, with the support section 45 being securely fixed to the bottom section 46 of the groove 44, the deformation force in the twisting direction of the vibration arm 34 is effectively countered. In such a manner, the deformation in the twisting direction can be prevented in a more effective manner.

Further, as already described above, the arm width W1 of the vibration arms 34 and 35 of the piezoelectric vibration piece 32 is preferably in a range from 50 μm to 150 μm. The groove depth D2 of the groove 44 is set to be 30 percent or more, but less than 50 percent of the material thickness of the vibration arms 34 and 35. With such a structure, the CI value can be low.

In this case, if the depth D2 of the groove 44 is less than 30 percent of the material thickness D1 of the vibration arm 34, the advantage of reduction of the CI value cannot be sufficiently obtained, and sometimes the CI value cannot be practical. With an exemplary tuning-fork vibrator of 32.768 kHz having an arm width of 100 μm, the CI value is about 100 kΩ, which is close to a limitation of practical range, even if the groove depth is 30 μm (30 percent of the material thickness) and the groove width is 70 μm (70 percent of the arm width, and with this dimension, the CI value is not reduced that much even if the groove width is widened more).

Moreover, if the depth D2 of the groove 44 exceeds 50 percent of the material thickness D1 of the vibration arm 34, it becomes impossible to form the groove 44 respectively to the surface and back sides of the vibration arm.

As shown in FIG. 3, the groove width W2 of the groove 44 of the piezoelectric vibration piece 32 is set to be 40 percent or more of the arm width W1 of the vibration arm. In this case, if the groove width W2 of the groove 44 is less than 40 percent of the arm width W1 of the vibration arm, the advantage of reduction of the CI value cannot be sufficiently obtained and, thus, the resulting CI value cannot be practical. With an exemplary tuning-fork vibrator of 32.768 kHz having an arm width of 100 μm, the CI value is about 100 kΩ, which is close to a limitation of a practical range when the groove depth is 45 μm (45 percent of the material thickness, and increasing the groove depth any further may penetrate the material, and is difficult to manufacture) and the groove width is 40 μm (40 percent of the arm width).

Further, preferably, the groove width W2 of the groove 44 can be 70 percent or more of the arm width W1 of the vibration arm. In this manner, the CI value will be in a range for maximizing the reduction effects thereof. Here, if the groove width W2 of the groove 44 is 100 percent of the arm width W1 of the vibration arm, needless to say, this does not allow groove formation.

Figure 5:
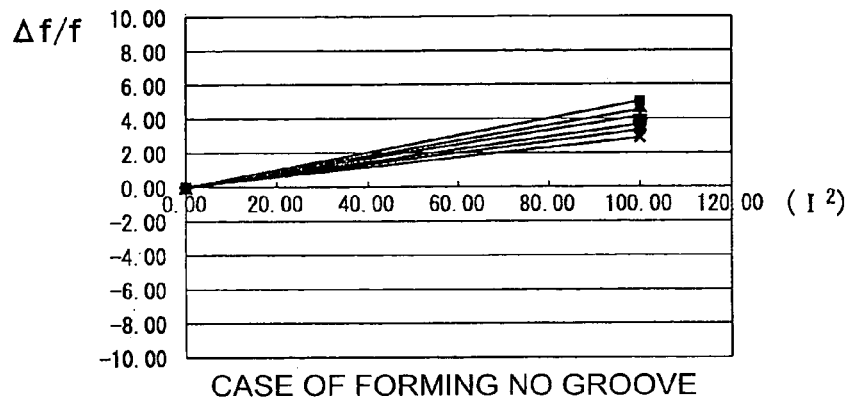
FIG. 5 is a graph showing the relationship between a frequency change ratio and a current based on an electrical field formed, at the time of driving, to the piezoelectric vibration piece whose vibration arm has no groove.
Figure 6:
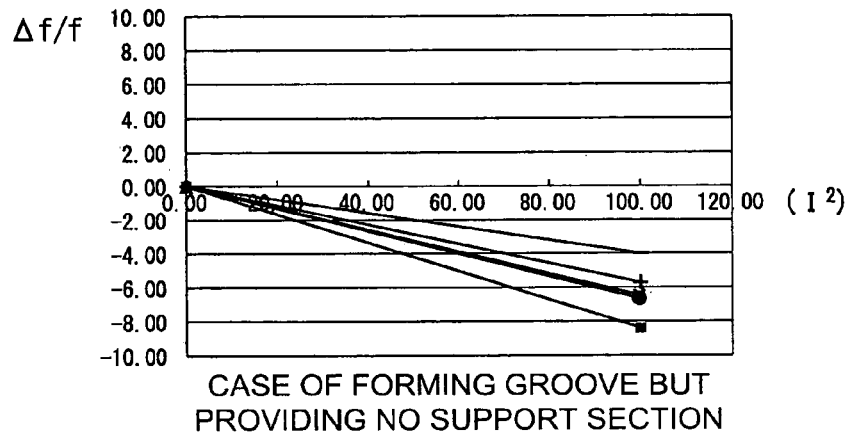
FIG. 6 is a graph showing the relationship between a frequency change ratio and a current based on an electrical field formed, at the time of driving, to the piezoelectric vibration piece whose vibration arm has a groove but no support section.
Figure 7:
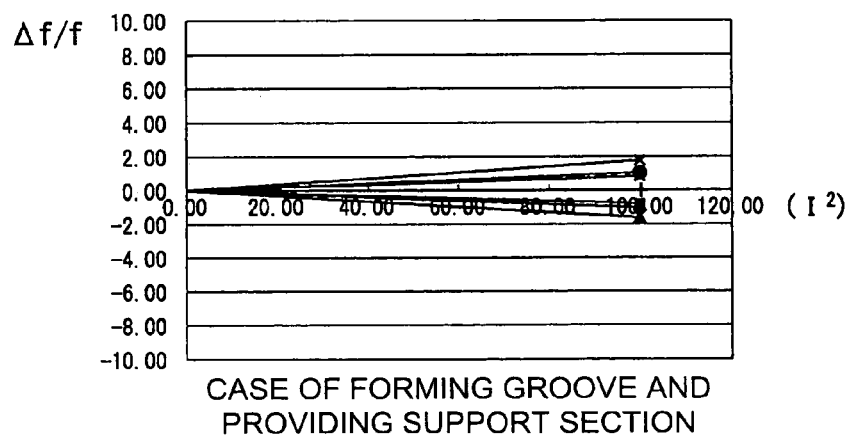
FIG. 7 is a graph showing the relationship between a frequency change ratio and a current based on an electrical field formed, at the time of driving, to the piezoelectric vibration piece of the present embodiment.

FIGS. 5 to 7 are graphs that depict simulation of the relationship between the frequency change rate and the current based on the electric field formed to the piezoelectric vibration piece at the time of driving.

With the piezoelectric vibration piece being a so-called tuning-fork type, assuming that Δf/f denotes a frequency change rate, and $I^2$ denotes a square value of the current flowing to the piezoelectric vibration piece, generally, the relationship of the following equation is generally established:

$$\Delta f/f = k1 \cdot I^2 + k2 \cdot I^2 \qquad (2)$$

Figure 13:
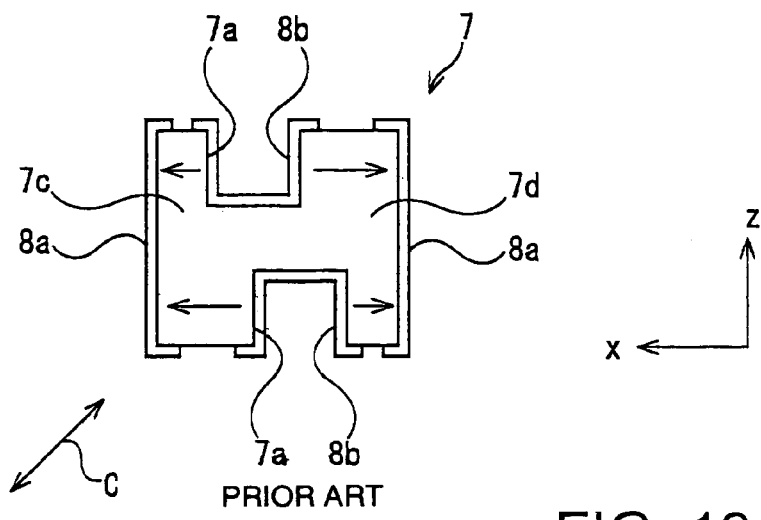
FIG. 13 is a cross-sectional view cut along B—B line of FIG. 12.

Herein, k1 is a constant (becomes a positive value) determined as an elastic body when the piezoelectric vibration piece vibrates in the horizontal direction (x direction of FIG. 13). k2 is a constant (becomes a negative value) determined as an elastic body when the piezoelectric vibration piece vibrates in the vertical direction (z direction of FIG. 13).

FIG. 5 shows a property of the piezoelectric vibration piece of a case where no groove is formed in the piezoelectric vibration piece. That is, for example, the grooves 44 are not provided to such a piezoelectric vibration piece 32 as shown in FIG. 3. In such a case, Δf/f denotes a positive value, and the vibration frequency varies in the range from 3 to 5 ppm.

FIG. 6 shows a property of the piezoelectric vibration piece of a case where the piezoelectric vibration piece is formed only with a groove. That is, the piezoelectric vibration piece 32 of FIG. 3 is provided with the grooves 44, but not with the support sections 45 and 45, for example. In such a case, due to the reasons described above and referring to FIG. 13, the vertical vibration component k2 becomes larger, Δf/f indicates a negative value, and the vibration frequency varies in the range from −8 to −4 ppm.

FIG. 7 shows a property of the piezoelectric vibration piece 32 of the present embodiment. That is, of the piezoelectric vibration piece in which the vibration arms 34 and 35 are formed with the grooves 44, and the support section 45 is formed in the groove 44. As shown in the drawing, compared with FIG. 6, it is understood that the vertical vibration component k2 is considerably reduced, and the variation ratio of the vibration frequency being Δf/f fits in the range of about −1 to +2.

Figure 8:
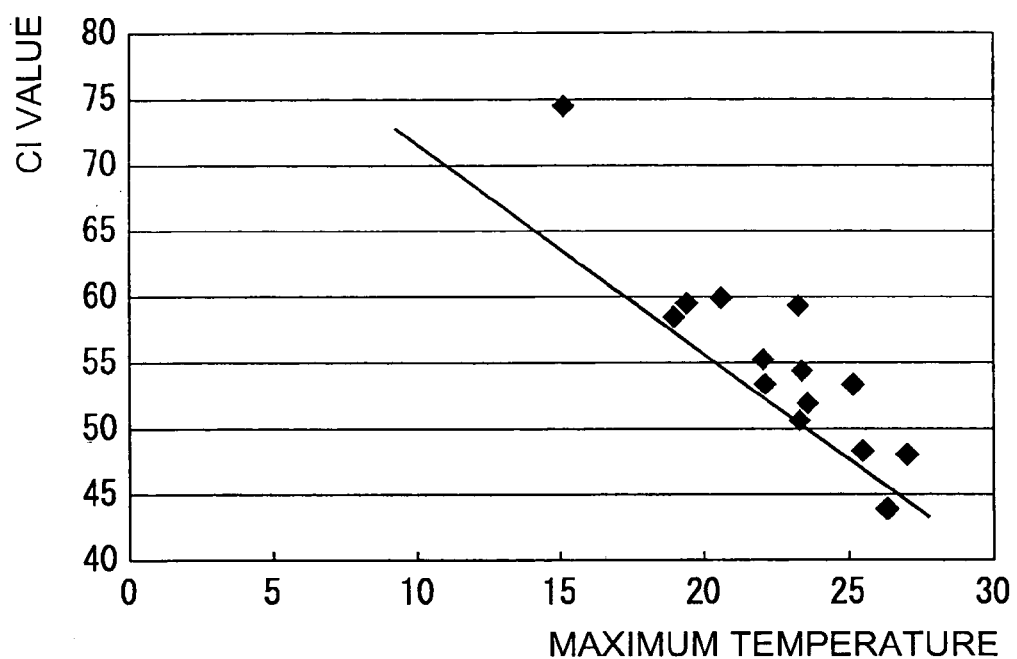
FIG. 8 is a graph showing the interrelation between a CI value and a temperature property as to the piezoelectric vibration piece of a so-called tuning fork type whose vibration arm has a groove but no support section.
Figure 9:
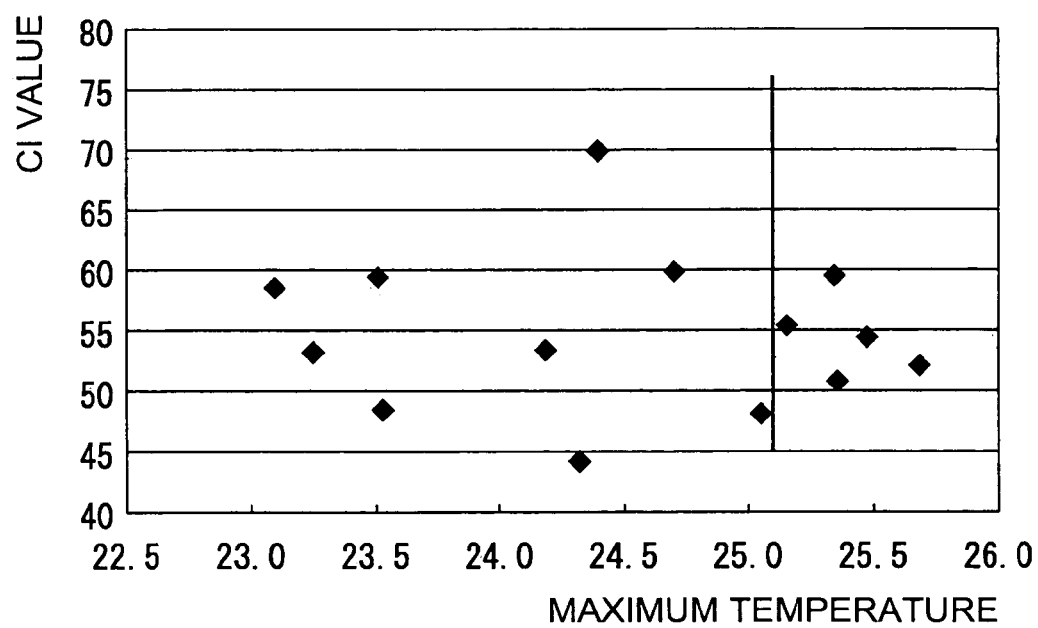
FIG. 9 is a graph showing the interrelation between a CI value and a temperature property as to the piezoelectric vibration piece of the present embodiment.
Figure 14:
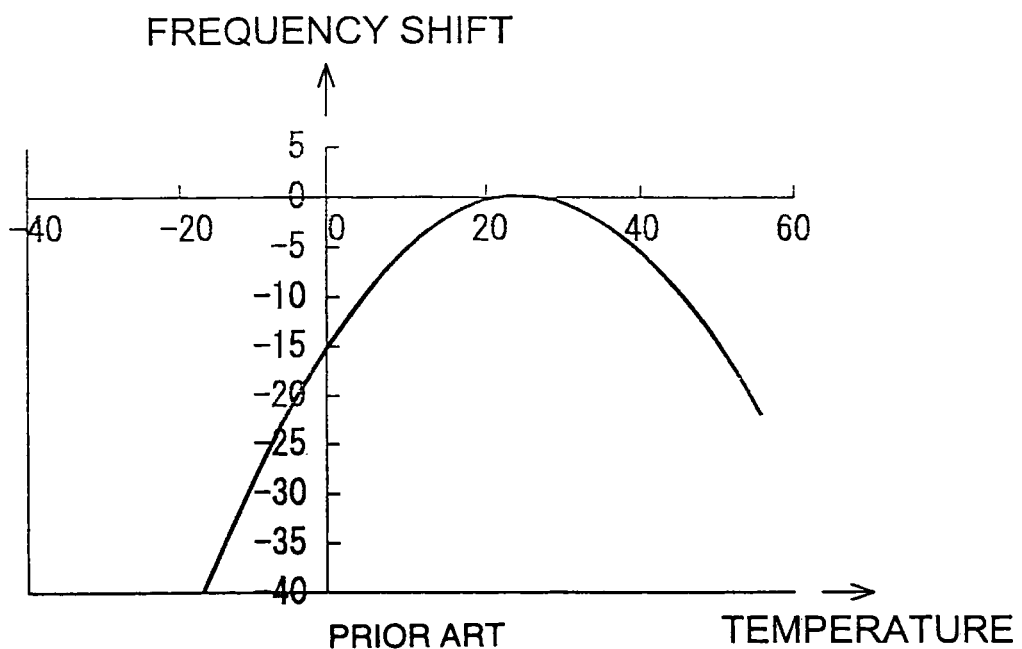
FIG. 14 is a graph showing the normal relationship between the frequency shift and the temperature property as to the piezoelectric vibration piece to be used for the piezoelectric device of FIG. 11.
Figure 15:
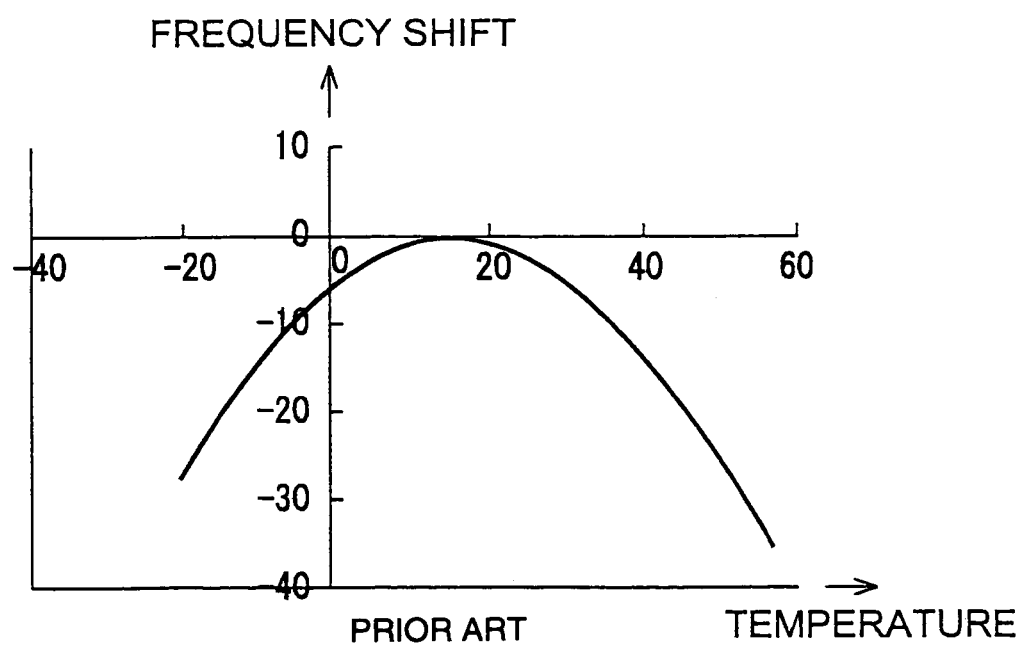
FIG. 15 is a graph showing the fact that the unfavorable relationship is observed between the frequency shift and the temperature property as to the piezoelectric vibration piece to be used for the piezoelectric device of FIG. 11.

FIGS. 8 and 9 are both graphs showing the interrelation between the CI value and the temperature property for the piezoelectric vibration piece of the so-called tuning-fork type. These graphs also show the relationship between the change of CI value and the maximum temperature described by referring to FIGS. 14 and 15.

FIG. 8 is a graph showing a CI value—temperature property of a case where the vibration arm is formed with a groove, but not with a support section. FIG. 9 is a graph showing a CI value—temperature property of the piezoelectric vibration piece 32 of the present embodiment.

In the case of FIG. 8, as the CI value changes (increases), the maximum temperature shifts to the negative side. On the other hand, in the case of the present embodiment of FIG. 9, the maximum temperature does not shift, even if the CI value changes.

That is, as FIG. 8, the reason why the interrelation is observed between the CI value and the maximum temperature is that, when the vibration arm is formed with a groove, but not with a support section, the vertical vibration component of the vibration arm becomes unstable. As shown in FIG. 9, if the vibration arm is formed with both a groove and a support section, the maximum temperature can be stable without depending on the CI value as shown in FIG. 9.

Figure 10:
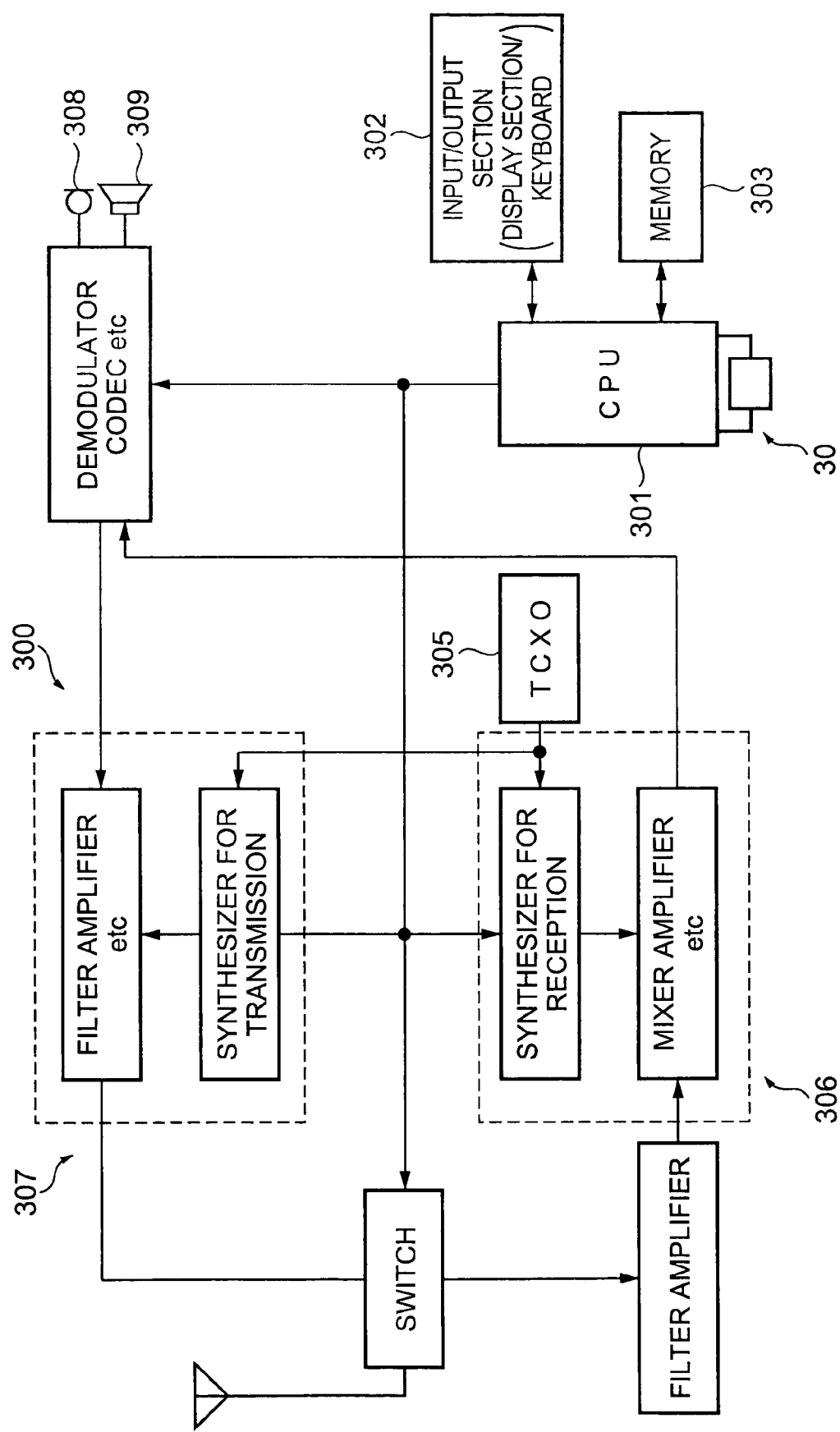
FIG. 10 is a diagram showing the schematic structure of a portable digital phone unit as exemplary electrical equipment utilizing the piezoelectric device according to the principles of the present invention.
Figure 11:
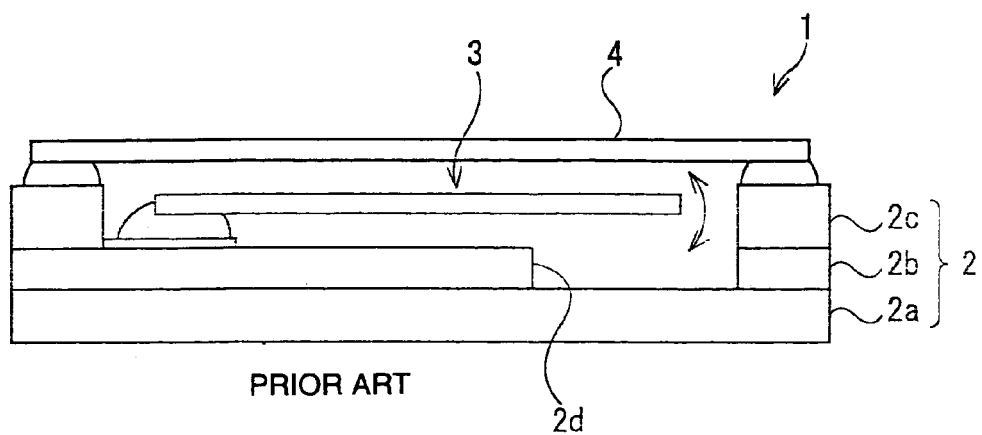
FIG. 11 is a schematic cross-sectional view showing an exemplary conventional piezoelectric device.
Figure 12:
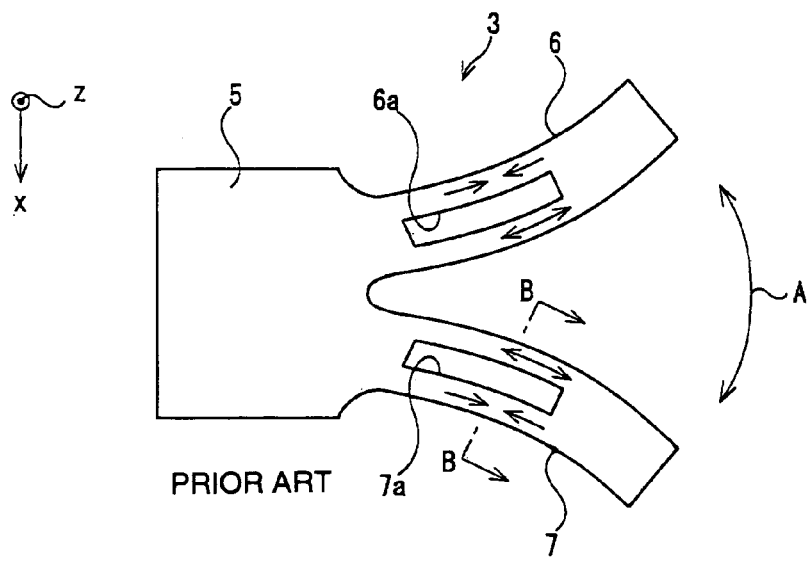
FIG. 12 is a schematic plan view of a piezoelectric vibration piece to be used for the piezoelectric device of FIG. 11.

FIG. 10 is a diagram showing the schematic structure of a portable digital phone unit as an example of the electric equipment using the piezoelectric device according to the above-described embodiment of the present invention.

In the drawing, included are a microphone 308 for receiving the voice of a caller, and a speaker 309 for converting the received content into a voice output. Further, a CPU (Central Processing Unit) 301 that is an integrated circuit or the like as a control section is connected to modulation and demodulation sections for a transmission and reception signal, is also included.

Other than modulation and demodulation of a transmission and reception signal, the CPU 301 controls an information input/output section 302 structured by an LCD as an image display section, and operation keys and others for information input, and information storage means 303 structured by RAM, ROM, and others. Thus, to the CPU 301, the piezoelectric device 30 is attached, and the output frequency thereof is used as a clock signal matching the control details by a predetermined frequency divider (not shown) incorporated in the CPU 301. The piezoelectric device 30 attached to the CPU 301 is not necessarily a single unit such as the piezoelectric device 30, but may be an oscillator as a result of combining the piezoelectric device 30 and the like, and any predetermine frequency divider and the like.

Further, the CPU 301 is connected to a temperature-compensated crystal oscillator (TCXO) 305, and the temperature-compensated crystal oscillator 305 is connected to both a transmission section 307 and a reception section 306. With such a structure, even if a basic clock from the CPU 301 varies responding to the change of the environment temperature, it is corrected by the temperature-compensated crystal oscillator 305 to be supplied to the transmission section 307 and the reception section 306.

As such, by using the piezoelectric vibration piece 32 and the piezoelectric device 30 using the same according to the present embodiment described above to such electric equipment as portable digital phone unit 300 including a control section, appropriate vibration can be realized without increasing the CI value by ensuring the rigidity along almost the entire length of the vibration arm with the movement of the vibration arm in the vertical direction suppressed. As such, a correct clock signal can be generated.

The present invention is not restricted to the above embodiments. Each structure of the embodiments can be combined together or omitted as appropriate, or combined with any other structures that are not shown.

Further, this invention is applicable to every piezoelectric device no matter what name they carry such as a piezoelectric vibrator, a piezoelectric oscillator, and the like as long as a piezoelectric vibration piece is accommodated in a package, a metal tubular case, and the like.

Still further, in the above embodiment, the package is in the shape of box made of a piezoelectric material. This is not restrictive, and the present invention is applicable to devices including any type of package or case as long as the package is at least partially light transmittable.

The invention claimed is:

1. A piezoelectric vibration piece, comprising:
   a pair of vibration arms that are formed of a piezoelectric material and extend in a horizontal direction from a base;
   a groove with a bottom that is provided in a length direction of each of the vibration arms; and
   a support member that is provided to cross the groove in a width direction to integrally connect portions of the vibration arm separated by the groove in the width direction.

2. The piezoelectric vibration piece according to claim 1, wherein an integral section of the support member is integrated with the bottom of the groove, and the integral section is thicker than at least an end section of the support member located on an opening side of the groove.

3. The piezoelectric vibration piece according to claim 1, wherein each of the vibration arms includes a surface side and a back side opposite the surface side, and the groove is provided in each of the surface side and the back side of each of the vibration arms.

4. The piezoelectric vibration piece according to claim 1, wherein each of the vibration arms has an arm width in a range from 50 $\mu$m to 150 $\mu$m, and a depth of the groove is at least 30 percent or more, but less than 50 percent of a thickness of each of the vibration arms.

5. The piezoelectric vibration piece according to claim 1, wherein a width of the groove provided in each of the vibration arms is at least 40 percent of an arm width of the corresponding vibration arm.

6. The piezoelectric vibration piece according to claim 5, wherein the width of the groove provided in each of the vibration arms is at least 70 percent of the arm width of the corresponding vibration arm.

7. A piezoelectric device accommodating a piezoelectric vibration piece, the piezoelectric vibration piece comprising:
   a pair of vibration arms extending in a horizontal direction from a base;
   a groove with a bottom that is provided in each of the vibration arms, and extends in a length direction of the corresponding vibration arm; and
   a support member crossing the groove in a width direction of the corresponding vibration arm and to integrally connecting portions of the vibration arm separated by the groove in the width direction.

8. Electronic equipment utilizing a piezoelectric device that accommodates a piezoelectric vibration piece, the piezoelectric vibration piece comprising:
   a pair of vibration arms laterally extending from a base;
   a groove with a bottom that is provided in each of the vibration arms, the groove extending in a length direction of the corresponding vibration arm; and
   a support member provided to cross the groove in a width direction of the corresponding vibration arm and integrally connecting portions of the vibration arm separated by the groove in the width direction,
   wherein upon vibration of the piezoelectric vibration piece, a clock signal is derived.

9. A piezoelectric vibration piece comprising: a base;
   at least one vibration arm formed of a piezoelectric material and extending from the base;
   the vibration arm including:
      a first surface having a first groove formed therein; and
      a second surface opposite the first surface, the second surface having a second groove formed therein; and
   a support member spanning each of the first and second grooves;
   wherein a bottom of each of the first and second grooves extends substantially orthogonally relative to the support member and is connected to the support member by an integral member angling therebetween and traversing a width of the grooves.

10. The piezoelectric vibration piece according to claim 9, wherein:
    the vibration arms have an arm width in a range from 50 $\mu$m to 150 $\mu$m; and
    a depth of the grooves is in a range of 30–50 percent of a thickness of each of the vibration arms.

11. The piezoelectric vibration piece according to claim 9, wherein a width of each groove provided in the vibration arms is at least 40 percent of an arm width of the corresponding vibration arm.

12. The piezoelectric vibration piece according to claim 9, wherein a width of the grooves provided in the vibration arms is at least 70 percent of an arm width of the corresponding vibration arm.

* * * * *